(12) United States Patent
Atta

(10) Patent No.: US 12,039,241 B2
(45) Date of Patent: Jul. 16, 2024

(54) LOGIC REPOSITORY SERVICE

(71) Applicant: Amazon Technologies, Inc., Seattle, WA (US)

(72) Inventor: Islam Mohamed Hatem Abdulfattah Mohamed Atta, Vancouver (CA)

(73) Assignee: Amazon Technologies, Inc., Seattle, WA (US)

( * ) Notice: Subject to any disclaimer, the term of this patent is extended or adjusted under 35 U.S.C. 154(b) by 0 days.

(21) Appl. No.: 18/203,799

(22) Filed: May 31, 2023

(65) Prior Publication Data

US 2023/0315957 A1 Oct. 5, 2023

Related U.S. Application Data

(63) Continuation of application No. 17/365,599, filed on Jul. 1, 2021, now Pat. No. 11,704,459, which is a continuation of application No. 16/933,610, filed on Jul. 20, 2020, now Pat. No. 11,074,380, which is a continuation of application No. 16/196,992, filed on Nov. 20, 2018, now Pat. No. 10,740,518, which is a continuation of application No. 15/280,656, filed on Sep. 29, 2016, now Pat. No. 10,162,921.

(51) Int. Cl.
| | |
|---|---|
| *G06F 30/343* | (2020.01) |
| *G06F 9/50* | (2006.01) |
| *G06F 15/78* | (2006.01) |
| *G06F 16/22* | (2019.01) |
| *G06F 30/327* | (2020.01) |
| *G06F 30/3312* | (2020.01) |
| *G06F 30/394* | (2020.01) |

(52) U.S. Cl.
CPC ............ *G06F 30/343* (2020.01); *G06F 9/50* (2013.01); *G06F 15/7871* (2013.01); *G06F 30/327* (2020.01); *G06F 30/3312* (2020.01); *G06F 30/394* (2020.01); *G06F 16/22* (2019.01)

(58) Field of Classification Search
USPC ........................................................ 716/104
See application file for complete search history.

(56) References Cited

U.S. PATENT DOCUMENTS

| | | | |
|---|---|---|---|
| 8,635,675 B2 * | 1/2014 | Kruglick | G06F 21/76 726/4 |
| 10,069,681 B2 * | 9/2018 | Izenberg | G06F 15/7867 |

(Continued)

FOREIGN PATENT DOCUMENTS

CN 116541073 A * 8/2023

*Primary Examiner* — Suresh Memula
(74) *Attorney, Agent, or Firm* — Klarquist Sparkman, LLP

(57) ABSTRACT

The following description is directed to a logic repository service. In one example, a method of a logic repository service can include receiving a first request to generate configuration data for configurable hardware using a specification for application logic of the configurable hardware. The method can include generating the configuration data for the configurable hardware. The configuration data can include data for implementing the application logic. The method can include receiving a second request to download the configuration data to a host server computer comprising the configurable hardware. The method can include transmitting the configuration data to the host server computer in response to the second request so that the configurable hardware is configured with the host logic and the application logic.

20 Claims, 8 Drawing Sheets

(56) References Cited

U.S. PATENT DOCUMENTS

| | | | |
|---|---|---|---|
| 10,223,317 B2* | 3/2019 | Atta | G06F 13/4068 |
| 10,275,288 B2* | 4/2019 | Pinto | G06F 9/4856 |
| 10,540,506 B2* | 1/2020 | Hoppert | G06F 9/45558 |
| 10,963,414 B2* | 3/2021 | Atta | G06F 15/7871 |
| 2001/0037458 A1* | 11/2001 | Kean | G06F 21/76 |
| | | | 713/193 |
| 2013/0145431 A1* | 6/2013 | Kruglick | G06F 21/76 |
| | | | 726/4 |
| 2018/0088992 A1* | 3/2018 | Davis | G06F 13/4068 |
| 2018/0089343 A1* | 3/2018 | Atta | G06F 30/3312 |
| 2018/0091484 A1* | 3/2018 | Atta | G06F 15/7871 |
| 2018/0095670 A1* | 4/2018 | Davis | G06F 21/51 |
| 2018/0139110 A1* | 5/2018 | Johnson | H04L 41/5096 |
| 2018/0189081 A1* | 7/2018 | Upasani | G06F 9/4401 |
| 2018/0302281 A1* | 10/2018 | Khan | H04L 12/4633 |
| 2019/0036713 A1* | 1/2019 | Slik | H04L 9/3278 |
| 2019/0108295 A1* | 4/2019 | Atta | G06F 30/394 |
| 2019/0199692 A1* | 6/2019 | Atta | H04L 9/3247 |
| 2020/0349310 A1* | 11/2020 | Atta | G06F 15/7871 |
| 2020/0412701 A1* | 12/2020 | Atta | H04L 63/0428 |
| 2021/0326503 A1* | 10/2021 | Atta | G06F 9/50 |

* cited by examiner ent application is a continuation of U.S. patent
LOGIC REPOSITORY SERVICE

CROSS-REFERENCE TO RELATED APPLICATION

The present application is a continuation of U.S. patent application Ser. No. 17/365,599, filed on Jul. 1, 2021, which is a continuation of U.S. patent application Ser. No. 16/933,610, filed on Jul. 20, 2020 (now U.S. Pat. No. 11,074,380), which is a continuation of U.S. patent application Ser. No. 16/196,992, filed on Nov. 20, 2018 (now U.S. Pat. No. 10,740,518), which is a continuation of U.S. application Ser. No. 15/280,656, filed Sep. 29, 2016 (now U.S. Pat. No. 10,162,921), titled LOGIC REPOSITORY SERVICE, which applications are incorporated herein by reference in their entirety.

BACKGROUND

Cloud computing is the use of computing resources (hardware and software) which are available in a remote location and accessible over a network, such as the Internet. In some arrangements, users are able to buy these computing resources (including storage and computing power) as a utility on demand. Cloud computing entrusts remote services with a user's data, software and computation. Use of virtual computing resources can provide a number of advantages including cost advantages and/or the ability to adapt rapidly to changing computing resource needs.

The users of large computer systems may have diverse computing requirements resulting from different use cases. A compute service provider can include various different computer systems having different types of components with varying levels of performance and/or functionality. Thus, a user can select a computer system that can potentially be more efficient at executing a particular task. For example, the compute service provider can provide systems with varying combinations of processing performance, memory performance, storage capacity or performance, and networking capacity or performance. However, some users may desire to use hardware that is proprietary or highly specialized for executing their computing tasks. Thus, the compute service provider can be challenged to provide specialized computing hardware for these users while keeping a healthy mix of generalized resources so that the resources can be efficiently allocated among the different users.

DETAILED DESCRIPTION

Figure 1:
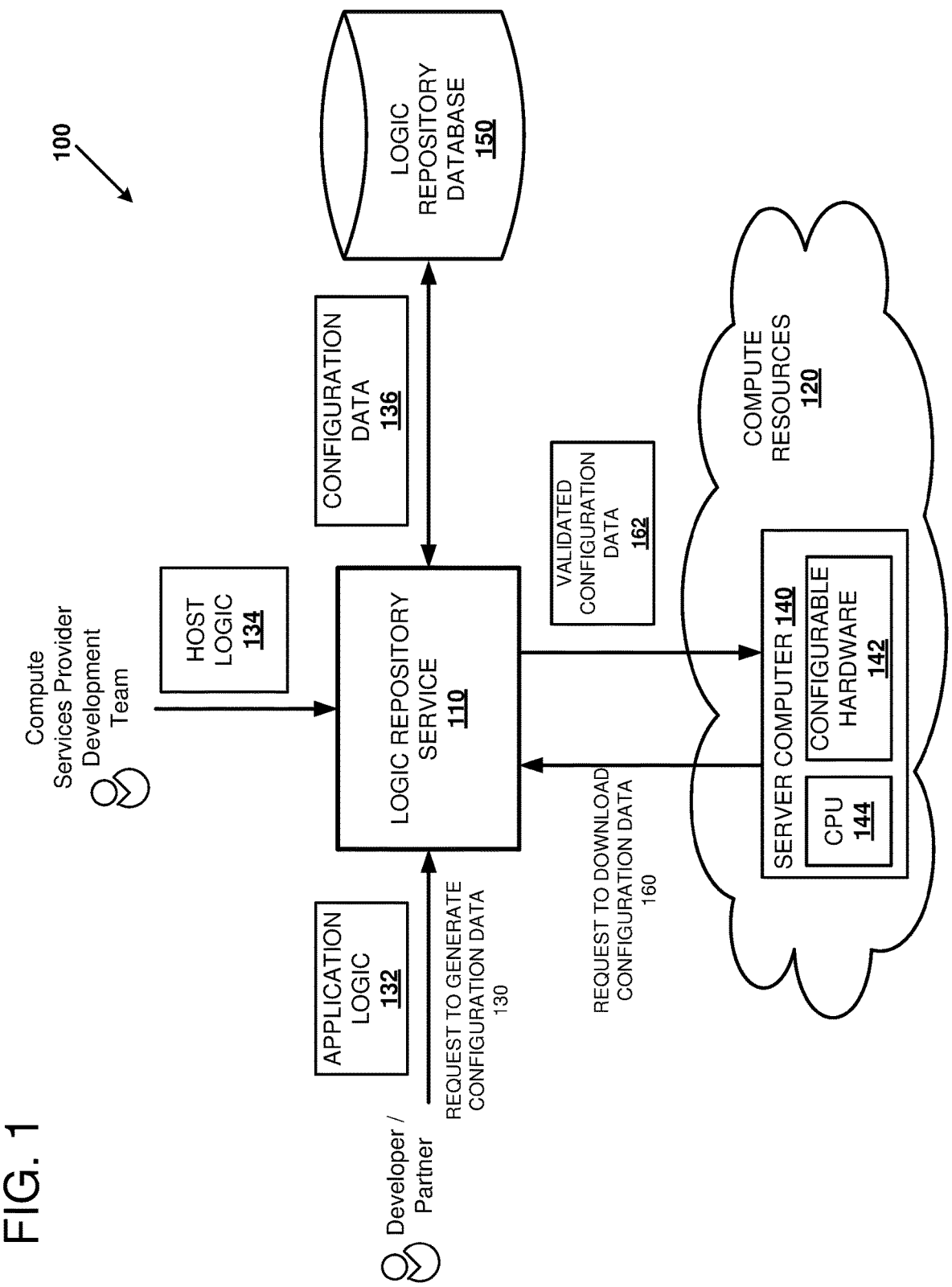
FIG. 1 is a system diagram showing an example of a system including a logic repository service for managing configuration data.

One solution for providing specialized computing resources within a set of reusable general computing resources is to provide a server computer comprising a configurable logic platform (such as by providing a server computer with an add-in card including a field-programmable gate array (FPGA)) as a choice among the general computing resources. Configurable logic is hardware that can be programmed or configured to perform a logic function that is specified by configuration data that is applied to the configurable logic. For example, a user of the computing resources can provide a specification (such as source code written in a hardware description language or other language) for configuring the configurable logic, the configurable logic can be configured according to the specification, and the configured logic can be used to perform a task for the user. However, allowing a user access to low-level hardware of the computing facility can potentially introduce security and privacy issues within the computing facility. As a specific example, a faulty or malicious design from one user could potentially cause a denial of service to other users if the configured logic caused one or more server computers within the computing facility to malfunction (e.g., crash, hang, or reboot) or be denied network services. As another specific example, a faulty or malicious design from one user could potentially corrupt or read data from another user if the configured logic is able to read and/or write memory of the other user's memory space. As another specific example, a faulty or malicious design from a user could potentially cause the configurable logic platform to malfunction if the configured logic includes a circuit (such as a ring oscillator) that causes the device to exceed a power consumption or temperature specification of the configurable logic platform.

As described herein, a compute services facility can include a variety of computing resources, where one type of the computing resources can include a server computer comprising a configurable logic platform. The configurable logic platform can be programmed or configured by a user of the computer system so that hardware (e.g., the configurable logic) of the computing resource is customized by the user. For example, the user can program the configurable logic so that it functions as a hardware accelerator that is tightly coupled to the server computer. For example, the hardware accelerator can be accessible via a local interconnect, such as Peripheral Component Interconnect Express (PCI-Express or PCIe), of the server computer. The user can execute an application on the server computer and tasks of the application can be performed by the hardware accelerator using PCIe transactions. By tightly coupling the hardware accelerator to the server computer, the latency between the accelerator and the server computer can be reduced which can potentially increase the processing speed of the application.

The compute services provider can manage the computing resources using software services to manage the configuration and operation of the configurable hardware. As one example, the compute service provider can execute a logic repository service for ingesting a hardware or logic design of a user, generating validated configuration data for configuring the configurable logic platform based on the logic design of the user, and downloading the validated configuration data in response to a request to configure an instance of the configurable logic platform. The download request can be from the user that developed the logic design or from a user that has acquired a license to use the logic design. Thus, logic designs can be created by the compute services provider, a user, or a third-party separate from the user or the compute services provider. For example, a marketplace of accelerator intellectual property (IP) can be provided to the users of the compute services provider, and the users can potentially increase the speed of their applications by selecting an accelerator from the marketplace.

The compute services provider can potentially increase the security and/or availability of the computing resources by using the logic repository service to validate that logic designs conform to requirements of the compute services provider. For example, the logic repository service can check that a user-created logic design (customer logic or application logic) is compatible with host logic provided by the compute services provider. When the configurable logic platform is configured, both the host logic and the application logic can be loaded onto the configurable logic platform. The host logic can provide a framework or sandbox for the application logic to work within. In particular, the host logic can communicate with the application logic and constrain the functionality of the application logic to potentially increase the security and/or availability of the computing resources. For example, the host logic can perform bridging functions between the local interconnect (e.g., the PCIe interconnect) and the application logic so that the application logic cannot directly control the signaling on the local interconnect. The host logic can be responsible for forming packets or bus transactions on the local interconnect and ensuring that the protocol requirements are met. By controlling transactions on the local interconnect, the host logic can potentially prevent malformed transactions or transactions to out-of-bounds locations.

FIG. 1 is a system diagram showing an example of a system 100 including a logic repository service 110 for managing configuration data that can be used to configure configurable resources within compute resources 120. In particular, the logic repository service 110 can be used for ingesting host and application logic into an infrastructure of a compute services provider, generating configuration data based on the ingested designs, maintaining a repository of the ingested designs and the generated configuration data, and providing configuration data for the configurable compute resources when the resources are deployed.

The logic repository service 110 can be a network-accessible service, such as a web service. Web services are commonly used in cloud computing. A web service is a software function provided at a network address over the web or the cloud. Clients initiate web service requests to servers and servers process the requests and return appropriate responses. The client web service requests are typically initiated using, for example, an API request. For purposes of simplicity, web service requests will be generally described below as API requests, but it is understood that other web service requests can be made. An API request is a programmatic interface to a defined request-response message system, typically expressed in JSON or XML, which is exposed via the web—most commonly by means of an HTTP-based web server. Thus, in certain implementations, an API can be defined as a set of Hypertext Transfer Protocol (HTTP) request interfaces, along with a definition of the structure of the messages used to invoke the API and the response messages, which can be in an Extensible Markup Language (XML) or JavaScript Object Notation (JSON) format. The API can specify a set of functions or routines that perform an action, which includes accomplishing a specific task or allowing interaction with a software component. When a web service receives the API request from a client device, the web service can generate a response to the request and send the response to the endpoint identified in the request. Additionally or alternatively, the web service can perform actions in response to the API request without generating a response to the endpoint identified in the request.

The logic repository service 110 can receive an API request 130 to generate configuration data for a configurable hardware platform, such as the configurable hardware 142 of the server computer 140. For example, the API request 130 can be originated by a developer or partner user of the compute services provider. The request 130 can include fields for specifying data and/or metadata about the logic design, the configurable hardware platform, user information, access privileges, production status, and various additional fields for describing information about the inputs, outputs, and users of the logic repository service 110. As specific examples, the request can include a description of the design, a production status (such as trial or production), an encrypted status of the input or output of the service, a reference to a location for storing an input file (such as the hardware design source code), a type of the input file, an instance type of the configurable hardware, and a reference to a location for storing an output file or report. In particular, the request can include a reference to a hardware design specifying application logic 132 for implementation on the configurable hardware platform. Specifically, a specification of the application logic 132 and/or of the host logic 134 can be a collection of files, such as source code, a netlist generated by a logic synthesis tool, and/or placed and routed logic gates generated by a place and route tool. The source code can include code written in a hardware description language (HDL), a register transfer logic (RTL) language, or a high-level language such as Open Computing Language (OpenCL) or C.

The compute resources 120 can include many different types of hardware and software categorized by instance type. In particular, an instance type specifies at least a portion of the hardware and software of a resource. For example, hardware resources can include servers with central processing units (CPUs) of varying performance levels (e.g., different clock speeds, architectures, cache sizes, and so forth), servers with and without co-processors (such as graphics processing units (GPUs) and configurable logic), servers with varying capacity and performance of memory and/or local storage, and servers with different networking performance levels. Example software resources can include different operating systems, application programs, and drivers. One example instance type can comprise the server computer 140 including a central processing unit (CPU) 144 in communication with the configurable hardware 142. The configurable hardware 142 can include programmable logic such as an FPGA, a programmable logic array (PLA), a programmable array logic (PAL), a generic array logic (GAL), or a complex programmable logic device (CPLD), for example. As specific examples, an "F1.small" instance type can include a first type of server computer with one capacity unit of FPGA resources, an "F1.medium" instance type can include the first type of server computer with two capacity units of FPGA resources, an "F1.large" instance type can include the first type of server computer with eight capacity units of FPGA resources, and an "F2.large" instance type can include a second type of server computer with eight capacity units of FPGA resources.

The logic repository service 110 can generate configuration data 136 in response to receiving the API request 130. The generated configuration data 136 can be based on the application logic 132 and the host logic 134. Specifically, the generated configuration data 136 can include information that can be used to program or configure the configurable hardware 142 so that it performs the functions specified by the application logic 132 and the host logic 134. As one example, the compute services provider can generate the host logic 134 including logic for interfacing between the CPU 144 and the configurable hardware 142. Specifically, the host logic 134 can include logic for masking or shielding the application logic 132 from communicating directly with the CPU 144 so that all CPU-application logic transactions pass through the host logic 134. In this manner, the host logic 134 can potentially reduce security and availability risks that could be introduced by the application logic 132.

Generating the configuration data 136 can include performing checks and/or tests on the application logic 132, integrating the application logic 132 into a host logic 134 wrapper, synthesizing the application logic 132, and/or placing and routing the application logic 132. Checking the application logic 132 can include verifying the application logic 132 complies with one or more criteria of the compute services provider. For example, the application logic 132 can be analyzed to determine whether interface signals and/or logic functions are present for interfacing to the host logic 134. In particular, the analysis can include analyzing source code and/or running the application logic 132 against a suite of verification tests. The verification tests can be used to confirm that the application logic is compatible with the host logic. As another example, the application logic 132 can be analyzed to determine whether the application logic 132 fits within a designated region of the specified instance type. As another example, the application logic 132 can be analyzed to determine whether the application logic 132 includes any prohibited logic functions, such as ring oscillators or other potentially harmful circuits. As another example, the application logic 132 can be analyzed to determine whether the application logic 132 has any naming conflicts with the host logic 134 or any extraneous outputs that do not interface with the host logic 134. As another example, the application logic 132 can be analyzed to determine whether the application logic 132 attempts to interface to restricted inputs, outputs, or hard macros of the configurable hardware 142. If the application logic 132 passes the checks of the logic repository service 110, then the configuration data 136 can be generated. If any of the checks or tests fail, the generation of the configuration data 136 can be aborted.

Generating the configuration data 136 can include compiling and/or translating source code of the application logic 132 and the host logic 134 into data that can be used to program or configure the configurable hardware 142. For example, the logic repository service 110 can integrate the application logic 132 into a host logic 134 wrapper. Specifically, the application logic 132 can be instantiated in a system design that includes the application logic 132 and the host logic 134. The integrated system design can synthesized, using a logic synthesis program, to create a netlist for the system design. The netlist can be placed and routed, using a place and route program, for the instance type specified for the system design. The placed and routed design can be converted to configuration data 136 which can be used to program the configurable hardware 142. For example, the configuration data 136 can be directly output from the place and route program.

As one example, the generated configuration data 136 can include a complete or partial bitstream for configuring all or a portion of the configurable logic of an FPGA. An FPGA can include configurable logic and non-configurable logic. The configurable logic can include programmable logic blocks comprising combinational logic and/or look-up tables (LUTs) and sequential logic elements (such as flip-flops and/or latches), programmable routing and clocking resources, programmable distributed and block random access memories (RAMs), digital signal processing (DSP) bitslices, and programmable input/output pins. The bitstream can be loaded into on-chip memories of the configurable logic using configuration logic (e.g., a configuration access port). The values loaded within the on-chip memories can be used to control the configurable logic so that the configurable logic performs the logic functions that are specified by the bitstream. Additionally, the configurable logic can be divided into different regions which can be configured independently of one another. As one example, a full bitstream can be used to configure the configurable logic across all of the regions and a partial bitstream can be used to configure only a portion of the configurable logic regions. The non-configurable logic can include hard macros that perform a specific function within the FPGA, such as input/output blocks (e.g., serializer and deserializer (SERDES) blocks and gigabit transceivers), analog-to-digital converters, memory control blocks, test access ports, and configuration logic for loading the configuration data onto the configurable logic.

The logic repository service 110 can store the generated configuration data 136 in a logic repository database 150. The logic repository database 150 can be stored on removable or non-removable media, including magnetic disks, direct-attached storage, network-attached storage (NAS), storage area networks (SAN), redundant arrays of independent disks (RAID), magnetic tapes or cassettes, CD-ROMs, DVDs, or any other medium which can be used to store information in a non-transitory way and which can be accessed by the logic repository service 110. Additionally, the logic repository service 110 can be used to store input files (such as the specifications for the application logic 132 and the host logic 134) and metadata about the logic designs and/or the users of the logic repository service 110. The generated configuration data 136 can be indexed by one or more properties such as a user identifier, an instance type or types, a marketplace identifier, a machine image identifier, and a configurable hardware identifier, for example.

The logic repository service 110 can receive an API request 160 to download configuration data. For example, the request 160 can be generated when a user of the compute resources 120 launches or deploys a new instance (e.g., an "F1.small" instance) within the compute resources 120. As another example, the request 160 can be generated in response to a request from an application executing on an operating instance. The request 160 can include a reference to the source and/or destination instance, a reference to the configuration data to download (e.g., an instance type, a marketplace identifier, a machine image identifier, or a configurable hardware identifier), a user identifier, an authorization token, and/or other information for identifying the configuration data to download and/or authorizing access to the configuration data. If the user requesting the configuration data is authorized to access the configuration data, the configuration data can be retrieved from the logic repository database 150, and validated configuration data 162 (e.g. a full or partial bitstream) can be downloaded to the requesting instance (e.g., server computer 140). The validated configuration data 162 can be used to configure the configurable logic of the destination instance.

The logic repository service 110 can verify that the validated configuration data 162 can be downloaded to the requesting instance. Validation can occur at multiple different points by the logic repository service 110. For example, validation can include verifying that the application logic 132 is compatible with the host logic 134. In particular, a regression suite of tests can be executed on a simulator to verify that the host logic 134 performs as expected after the application logic 132 is added to the design. Additionally or alternatively, it can be verified that the application logic 132 is specified to reside only in reconfigurable regions that are separate from reconfigurable regions of the host logic 134. As another example, validation can include verifying that the validated configuration data 162 is compatible with the instance type to download to. As another example, validation can include verifying that the requestor is authorized to access the validated configuration data 162. If any of the validation checks fail, the logic repository service 110 can deny the request to download the validated configuration data 162. Thus, the logic repository service 110 can potentially safeguard the security and the availability of the computing resources 120 while enabling a user to customize hardware of the computing resources 120.

Figure 2:
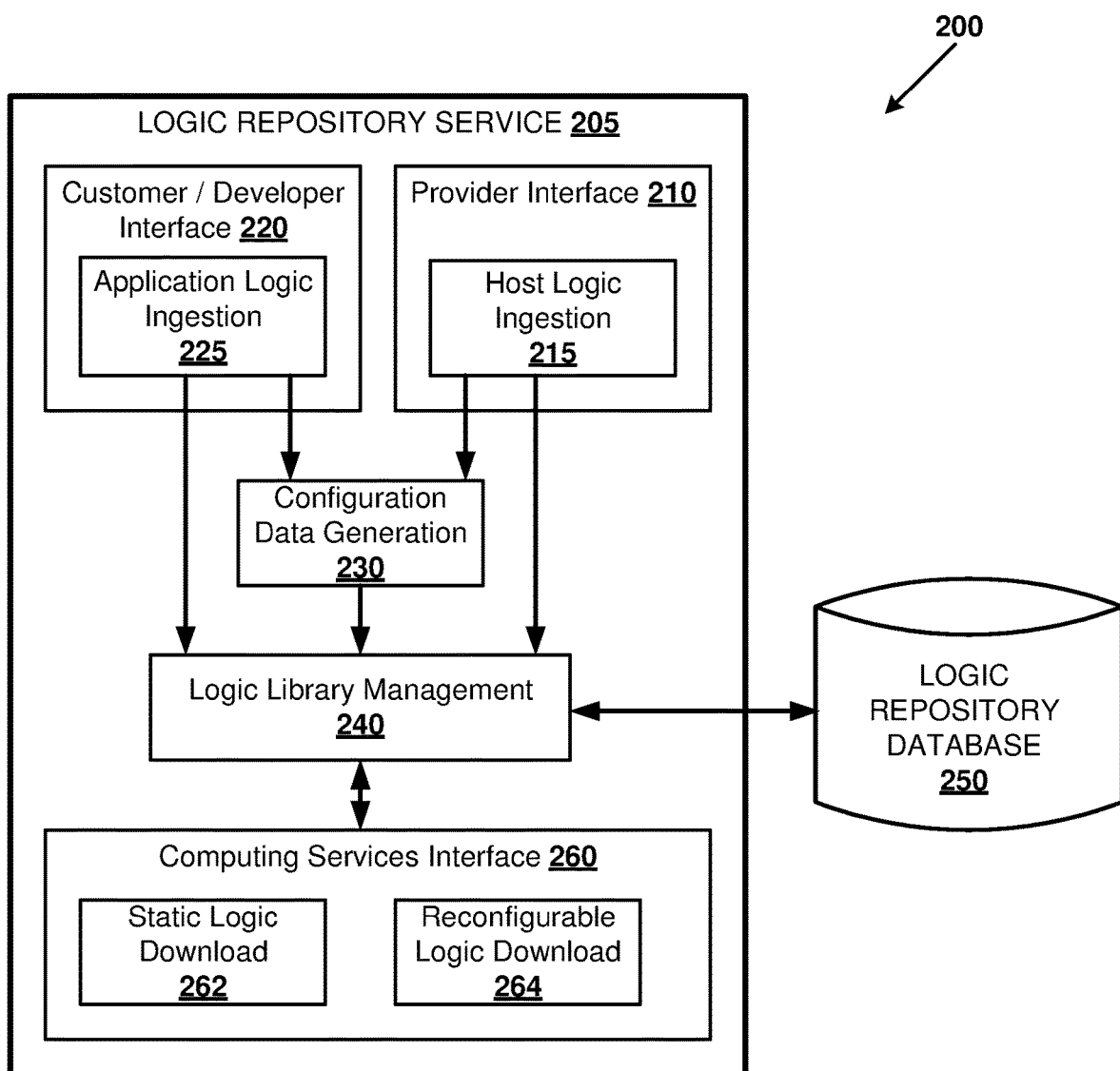
FIG. 2 is a system diagram showing an example architecture of a logic repository service.

FIG. 2 is a system diagram showing an example architecture 200 of a logic repository service 205. The logic repository service 205 can be software executing on a server computer managed by a compute services provider. The logic repository service 205 can be accessed through one or more web APIs.

The logic repository service 205 can include a provider interface 210 for servicing API requests by the compute service provider. The provider interface 210 can be used to authenticate that requests are from agents of the compute service provider, such as by authenticating the identity of the requestor using credentials provided in the request. The provider interface 210 can provide host logic ingestion functionality 215. In particular, the provider interface 210 can receive a request to upload a host logic design to the logic repository service 205 and the request can be processed by the host logic ingestion functionality 215. As described previously, the host logic can include logic for sandboxing the application logic to maintain the security and availability of the computing resources. Additionally, the host logic can be further divided into static logic and reconfigurable logic. The static logic can be configured during an initialization sequence (e.g., at boot time), whereas the reconfigurable logic can be configured at different times during the operation of the configurable logic. As one example, the PCI Express interface can specify that a PCI endpoint be booted and enumerated within about one hundred milliseconds after a reset signal is deasserted. The host logic can be divided into static logic that can be loaded within the allotted time window, and reconfigurable logic that can be loaded after the time window has passed. The static logic can be used as an interface between different reconfigurable regions. The host logic design can be specified using HDL or register transfer logic (RTL) source code, such as Verilog or VHDL. The RTL can be encrypted or non-encrypted. The host logic ingestion module 215 can be used to perform checks on the received host logic design, decrypt the host logic design, and/or provide versioning information for the host logic design. Additionally, the request can include information for associating the host logic design with one or more instance types. For example, some host logic designs may work only with one subset of instance types and other host logic designs may work only with a different subset of instance types.

The logic repository service 205 can include a customer-developer interface 220 for servicing API requests from the users of the logic repository service 205. The customer-developer interface 220 can be used to authenticate that requests are from users of the compute service provider, such as by authenticating the identity of the requestor using credentials provided in the request. For example, each of the users can be provided with an account that can be used to identify the user for access management, billing, and usage tracking. The users can be limited to viewing and modifying only the logic designs to which they are authorized to access. For example, the users can be prevented from uploading and/or modifying host logic.

The customer-developer interface 220 can include application logic ingestion functionality 225 for receiving and/or processing an application logic design. The application logic design can be specified using source code (e.g., HDL or RTL code), a netlist including a list of configurable logic blocks and the connections between the configurable logic blocks, and/or configuration data. For example, the configuration data can include a full or partial bitstream which has been pre-compiled before being uploaded to the logic repository service. The application logic will be combined with host logic (such as by a configuration data generation block 230) to create the logic that can be loaded onto a configurable hardware platform. Processing the application logic design can include translating and/or compiling source code to a lower level format (e.g., compiling OpenCL to generate behavioral or structural Verilog), verifying that required logic and/or signals are present (such as interface signals to the host logic), verifying that known restricted circuits are not present (such as ring oscillators), and other various tasks in preparation for generating configuration data.

The customer-developer interface 220 can accept various types of requests from a user. As one example, a user can request to create a configurable hardware image (CHI). A CHI can provide information for configuring an instance of configurable hardware within a computing environment. For example, a CHI can include one or more compatible instance types, the configuration data for configuring the configurable hardware, access permissions for controlling access to the CHI, and any other information associated with configuring the configurable hardware. The request to create the CHI can include fields for a design description or title, a production status of the design, whether or not the design is encrypted, a reference to source code for the design, a type of source code indicator, an instance type or types that are compatible with the configuration data, and a reference to a location to store reporting information.

As another example, a second request type can be used to retrieve information about CHIs that are associated with the user. In particular, the request can include fields such as a CHI identifier, a machine image (MI) identifier, a product code, an instance type, and an instance identifier. In response to the request, the customer-developer interface 220 can present information about the CHIs that are associated with the user that match one or more of the fields in the request. For example, all CHIs matching the search fields can be listed along with a status associated with each CHI. The CHI can be reported to be in a trial or production state, or in a complete or in-progress state. For example, it can take multiple hours to create a CHI from source code and so this request can be used to check a status of synthesis or implementation of the CHI.

As another example, a third type of request can be to associate a CHI to an MI. An MI can provide information for launching an instance of computing resources within a computing environment. In one embodiment, the instance is a virtual machine executing within a hypervisor executing on a server computer within the computing environment. An MI can include a type of the instance (such as by specifying an architecture, a CPU capability, a co-processor, a peripheral, and/or a configurable hardware design), a template for a root volume (e.g., including an operating system, device drivers, and/or applications) for the instance, and access permissions (e.g., a list of accounts authorized to use the MI) for controlling the accessibility of the MI, and a block device mapping for specifying volumes to attach to the instance when it is launched. By associating an MI to a CHI, the configurable data associated with the CHI can be downloaded to configurable logic of a server computer when a virtual machine based on the MI is launched.

As another example, a fourth type of request can be to publish a CHI to a marketplace. For example, a product code can be associated with the CHI, which can enable the CHI to be listed in a marketplace. The marketplace can be viewable by users of the compute services provider, and can provide a list of hardware accelerator IP that has been developed by one user and is available for license or purchase by another user. When a user buys or licenses a CHI published in the marketplace, the account information of the user can be added to the list of users that can access the CHI.

The configuration data generation block 230 can be used to create configuration data. For example, the configuration data can be based on an application logic design and a host logic design. As another example, the configuration data can be based on only an application logic design or only a host logic design. In particular, the configuration data generation block 230 can generate static logic based only on the host logic design. Additionally, the configuration data generation block 230 can generate reconfigurable logic for one or more reconfigurable regions of the configurable logic. For example, the configuration data generation block 230 can be used to generate host reconfigurable logic for a region reserved for host functions. As another example, the configuration data generation block 230 can be used to generate application reconfigurable logic for a region reserved primarily for application functions.

Inputs to the configuration data generation block 230 can be an application logic design (such as from the application logic ingestion 225), a host logic design (such as from the host logic ingestion 215), and/or constraints describing various implementation details (such as clock frequencies, partitioning information, placement information, a target technology, and so forth). The logic designs can include source code described using an HDL, a netlist, and/or configuration data. The configuration data generation block 230 can combine an application and a host design into one design to create the configuration data. As described in more detail with reference to FIG. 3, the configuration data generation block 230 can include a logic synthesis tool and a place and route tool. Using these tools, the configuration data generation block 230 can create configuration data for loading on a configurable hardware platform.

The output from the configuration data generation block 230 can be managed using the logic library management block 240. For example, the logic library management block 240 can associate user information with the configuration data and store the information at the logic repository database 250. The logic library management block 240 can be used to maintain the ownership and versioning of various logic components and source input files. The logic library management block 240 can perform encryption and decryption of the design source code files and of the CHI files so that the files can be stored encrypted at the logic repository database 250. By encrypting the files, the intellectual property of different users can be safeguarded.

The computing services interface 260 can be used as an interface between the logic repository service 205 and computing resources. For example, when an instance is created on the computing resources, an API request can be sent to the computing services interface 260 and configuration data can be downloaded to the requesting resource. A first type of request can be in response to initiating or deploying a new instance on a server computer of the compute resources. For example, the request can be for static logic to load and boot before the configurable logic is enumerated on interconnect of the server computer. In particular, the request can be serviced by the static logic download block 265, which can retrieve configuration data from the logic repository database 250 via the logic library management block 240. The static logic download component 265 can be used to download static logic to the configurable hardware platform on the requesting instance. Additionally, a request can be for reconfigurable logic, and the reconfigurable logic download component 264 can be used to service the request. Specifically, the reconfigurable logic download can retrieve the configuration data through the logic repository database 250 via the logic library management block 240. The request can be for reconfigurable host logic or for reconfigurable application logic. The request for reconfigurable logic can be in response to initiating or deploying a new instance on a server computer of the compute resources. Alternatively, the request for reconfigurable logic can be in response to a client application running on the server computer requesting the reconfigurable logic. For example, an application program running on the server computer can request to have different hardware accelerators downloaded to the configurable hardware platform at different points of the program. The computing services interface 260 can authenticate requests so that only users with access privileges to retrieve the configurable logic data can download the configuration data. For example, the request can include an authorization token, and if the authorization token matches an expected authorization token, the request can be serviced. Otherwise, the request can be denied.

The computing services interface 260 can also be used to receive information from the computing resources. For example, the computing services interface 260 can receive status updates from the computing resources when instances are created, reconfigured, or used on the computing resources. As a specific example, the computing services interface 260 can be notified whether configuration data was successfully deployed on a computing resource. For example, the configuration data may fail to be deployed due to a hardware malfunction or for other reasons. The computing services interface 260, in conjunction with the logic library management block 240, can maintain usage data, failure reports, and/or statistics about the different designs stored in the logic repository database 250. The statistics can be provided to the compute services provider or the user upon demand when a request is received at the provider interface 210 or the customer/developer interface 220, for example.

Figure 3:
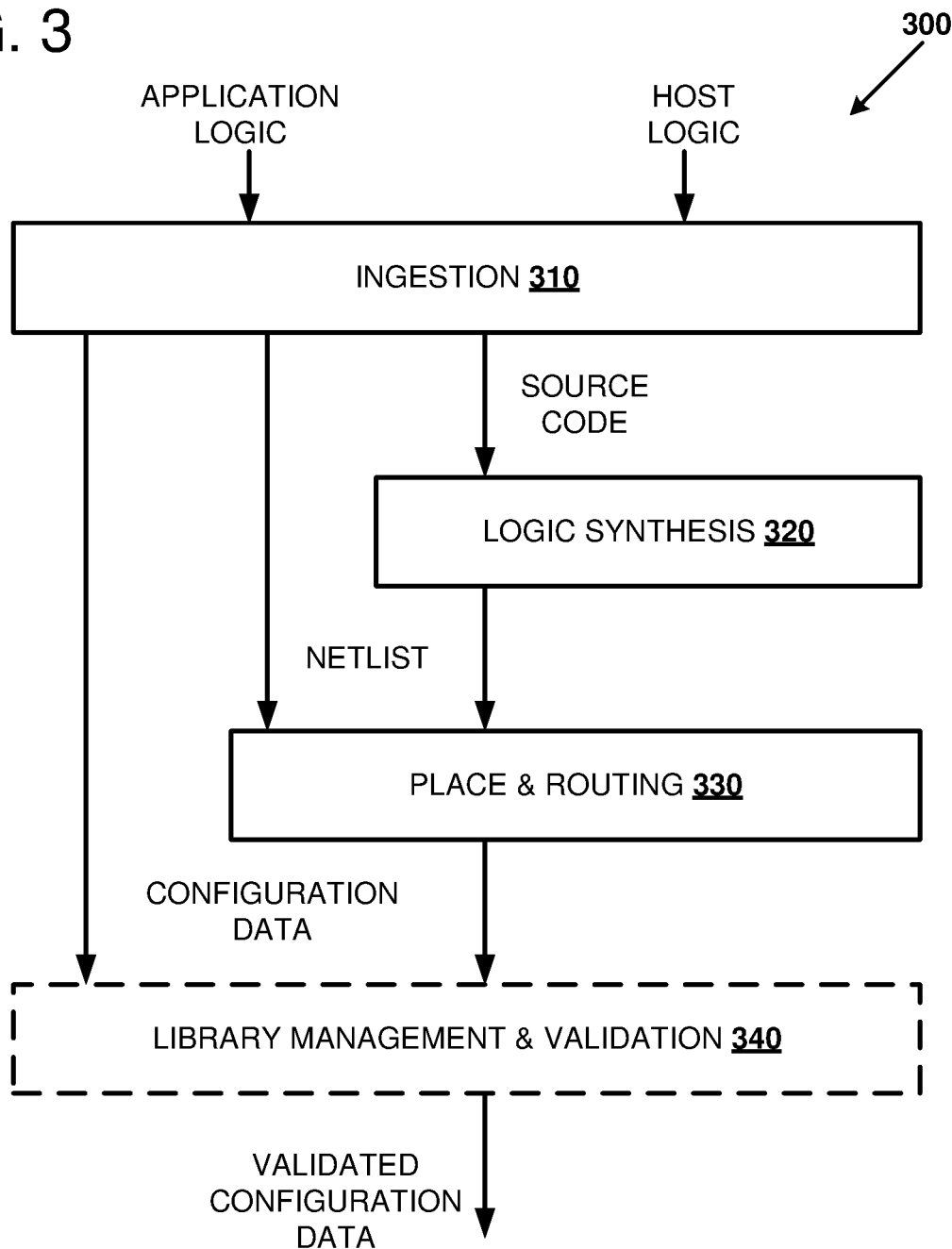
FIG. 3 illustrates an example of ingestion and generation of configuration data as can be performed by a logic repository service.

FIG. 3 illustrates an example flow 300 of ingesting logic designs and producing configuration data as can be performed by a logic repository service. During ingestion 310, an application logic design and/or a host logic design can be received by a logic repository service. The logic design can be encrypted, such as by using the IEEE 1735-2014 encryption standard. The logic design can be decrypted during ingestion 310 or during a later step of the flow 300.

As one example, source code for the application logic and the host logic can be received during the ingestion 310 and the application logic and the host logic can be combined into a single design to produce source code for logic synthesis 320. The logic synthesis 320 can be used to transform a specification written in behavioral and/or structural RTL into a netlist based on a target technology. For example, the logic synthesis 320 can target different configurable logic technologies, such as FPGAs having different architectures, manufacturing processes, capacities, and/or manufacturers. The netlist can include a number of configurable logic blocks, non-configurable blocks (e.g., hard macros), and the connections between the different blocks. The netlist can be a logical netlist where blocks of the netlist are enumerated but unplaced within the target technology. The netlist can be used as input to place and route 330. The place and route 330 can take the instances of the configurable blocks from the netlist and the routing information, and map the blocks to a physical device. The place-and-routed design can include a physical mapping for each of the logical components of the netlist. Additionally or alternatively, the place and route 330 can be timing driven so that the netlist is modified based on timing constraints of the design and the physical constraints of the physical device. The output of the place and route 330 can be configuration data, such as a bitstream image. The configuration data can be partitioned or divided into different components. For example, the configuration data can include data associated with static host logic, reconfigurable host logic, and/or reconfigurable application logic. The different components can be overlapping or non-overlapping. For example, the static host logic can be routed through regions that are used by the reconfigurable application logic. Thus, a partial bitstream for the reconfigurable application logic can also include portions of the static host logic.

As another example, a netlist for the application logic and/or the host logic can be received during the ingestion 310. As a specific example, a netlist can be received for the application logic and source code can be received for the host logic. In this case, the host logic can be synthesized with the logic synthesis 320 to generate a netlist for the host logic, and the netlists for the host and application logic can be combined into a single design to produce a netlist for the place and route 330. As another example, configuration data for the application logic and/or the host logic can be received during the ingestion 310. For example, a partial bitstream for the application logic design can be received, or a full bitstream for the host and application logic design can be received.

The logic repository service can also include library management and validation 340 functionality. For example, each step of the flow 300 can generate intermediate data and/or files that can be stored in a database. In particular, the database can be indexed by a developer's account identifier, so that the developer can access source code, reports, and configuration data associated with the developer. As one example, source code for application logic can be associated with a developer's account identifier during ingestion 310. The source code can be associated with a version identifier that is provided by the developer or generated during ingestion 310. Multiple versions of source code can be maintained for an account and stored within the database. Each version of the application logic can be associated with a version of the host logic. Each version of configuration data can correspond to a particular version of the application logic and a particular version of the host logic. A bitstream or CHI identifier can be created when configuration data is generated, and the source code, netlist, and reports can be labelled with the CHI identifier. The reports can be generated at the various steps of the flow 300 to provide information about the logic designs. For example, one or more synthesis reports can be generated by the logic synthesis 320 and one or more reports can be generated by the place and routing 330. As one example, an implementation report can be generated to provide information about a utilization of the logic designs. In particular, a percentage of the hardware resources used by the design can be provided so that the design can be implemented on appropriate instance types.

As another example, a timing report can provide a static timing analysis showing whether the design meets timing specifications of the configurable hardware. The logic synthesis 320 and the place and route 330 can involve random, non-deterministic steps that vary with each run of the tools so that each run of the logic synthesis 320 and the place and route 330 may provide different results. Thus, if a developer has a design that does not meet timing (as indicated by the timing report), the developer may desire to rerun the logic synthesis 320 and/or the place and route 330. In this manner, the developer can iterate on their design by executing multiple synthesis and routing runs for the same design. When one of the synthesis and place and route runs yields results that meet the timing specifications of the configurable hardware logic, the developer can mark that run as a production run. For example, the developer can change the status of the CHI generated from that run to production and can associate a bitstream identifier with the generated configuration data.

The library management and validation 340 functionality can be used to validate the user designs for the configurable logic at various points during the development and deployment steps. As one example, the validation 340 can include performing simulations to verify whether the application logic is compatible with the host logic so that the host logic can constrain the functionality of the application logic. The validation 340 can include comparing a netlist of the application logic and confirming that the application logic meets capacity and area restraints of the configurable hardware platform. For example, the application logic can be restricted to use only logic within one or more reconfigurable regions. If the application logic is outside of those regions, then the application logic can be rejected. Additionally, the application logic can be ingested as a bitstream, and the bitstream can be validated by the validation 340. The validation of a bitstream can include comparing a portion of the ingested bitstream data corresponding to the host logic to a baseline version of the host logic to confirm that the host logic is not corrupted. The output from the validation block 340 can be validated configuration data.

Figure 4:
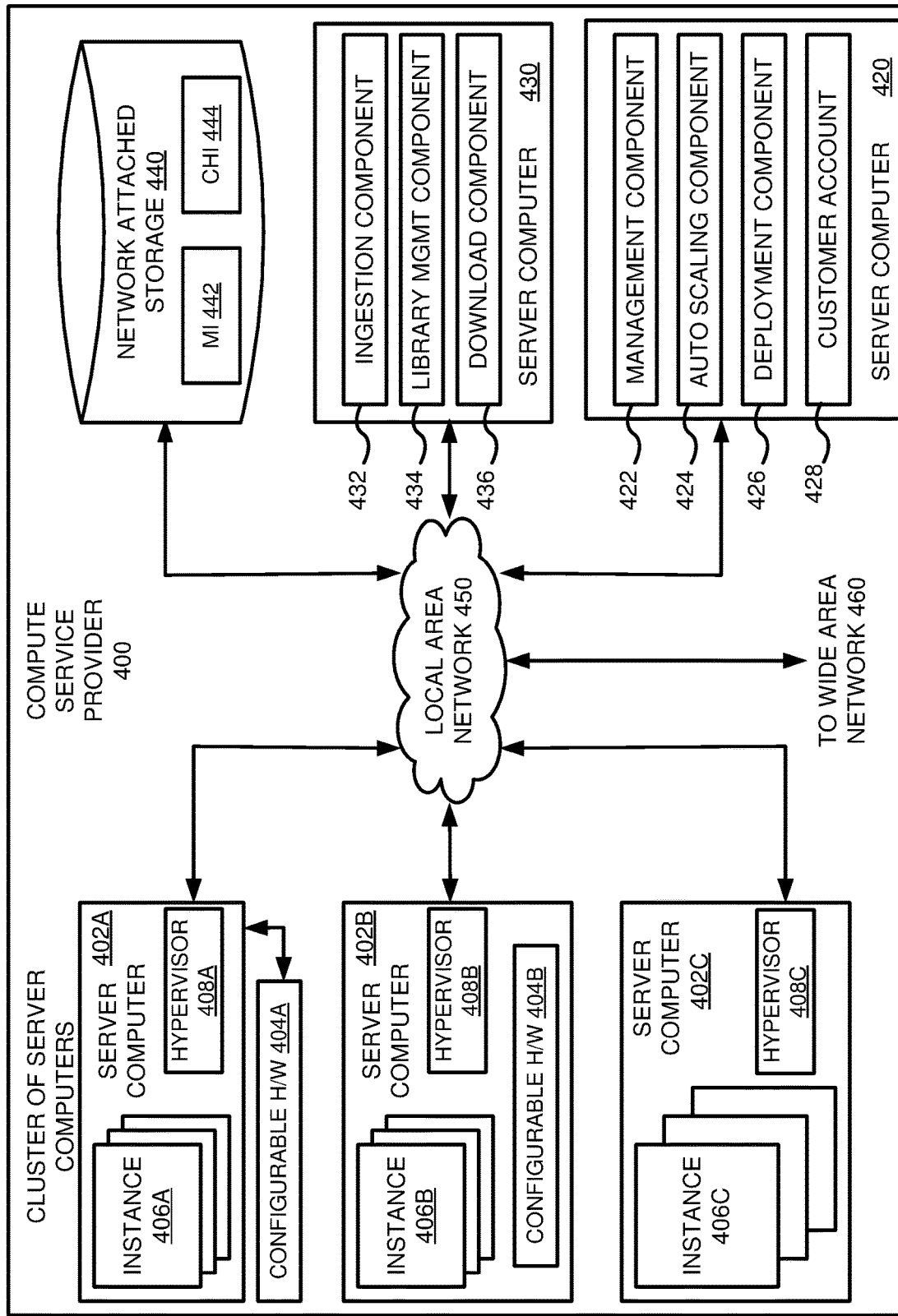
FIG. 4 is an example system diagram showing a plurality of virtual machine instances running in a multi-tenant environment including a logic repository service.

FIG. 4 is a computing system diagram of a network-based compute service provider 400 that illustrates one environment in which embodiments described herein can be used. By way of background, the compute service provider 400 (i.e., the cloud provider) is capable of delivery of computing and storage capacity as a service to a community of end recipients. In an example embodiment, the compute service provider can be established for an organization by or on behalf of the organization. That is, the compute service provider 400 may offer a "private cloud environment." In another embodiment, the compute service provider 400 supports a multi-tenant environment, wherein a plurality of customers operate independently (i.e., a public cloud environment). Generally speaking, the compute service provider 400 can provide the following models: Infrastructure as a Service ("IaaS"), Platform as a Service ("PaaS"), and/or Software as a Service ("SaaS"). Other models can be provided. For the IaaS model, the compute service provider 400 can offer computers as physical or virtual machines and other resources. The virtual machines can be run as guests by a hypervisor, as described further below. The PaaS model delivers a computing platform that can include an operating system, programming language execution environment, database, and web server. Application developers can develop and run their software solutions on the compute service provider platform without the cost of buying and managing the underlying hardware and software. Additionally, application developers can develop and run their hardware solutions on configurable hardware of the compute service provider platform. The SaaS model allows installation and operation of application software in the compute service provider. In some embodiments, end users access the compute service provider 400 using networked client devices, such as desktop computers, laptops, tablets, smartphones, etc. running web browsers or other lightweight client applications. Those skilled in the art will recognize that the compute service provider 400 can be described as a "cloud" environment.

The particular illustrated compute service provider 400 includes a plurality of server computers 402A-402C. While only three server computers are shown, any number can be used, and large centers can include thousands of server computers. The server computers 402A-402C can provide computing resources for executing software instances 406A-406C. In one embodiment, the software instances 406A-406C are virtual machines. As known in the art, a virtual machine is an instance of a software implementation of a machine (i.e. a computer) that executes applications like a physical machine. In the example of a virtual machine, each of the servers 402A-402C can be configured to execute a hypervisor 408 or another type of program configured to enable the execution of multiple software instances 406 on a single server. Additionally, each of the software instances 406 can be configured to execute one or more applications.

It should be appreciated that although the embodiments disclosed herein are described primarily in the context of virtual machines, other types of instances can be utilized with the concepts and technologies disclosed herein. For instance, the technologies disclosed herein can be utilized with storage resources, data communications resources, and with other types of computing resources. The embodiments disclosed herein might also execute all or a portion of an application directly on a computer system without utilizing virtual machine instances.

The server computers 402A-402C can include a heterogeneous collection of different hardware resources or instance types. Some of the hardware instance types can include configurable hardware that is at least partially configurable by a user of the compute service provider 400. One example of an instance type can include the server computer 402A which is in communication with configurable hardware 404A. Specifically, the server computer 402A and the configurable hardware 404A can communicate over a local interconnect such as PCIe. Another example of an instance type can include the server computer 402B and configurable hardware 404B. For example, the configurable logic 404B can be integrated within a multi-chip module or on the same die as a CPU of the server computer 402B. Yet another example of an instance type can include the server computer 402C without any configurable hardware. Thus, hardware instance types with and without configurable logic can be present within the resources of the compute service provider 400.

One or more server computers 420 can be reserved for executing software components for managing the operation of the server computers 402 and the software instances 406. For example, the server computer 420 can execute a management component 422. A customer can access the management component 422 to configure various aspects of the operation of the software instances 406 purchased by the customer. For example, the customer can purchase, rent or lease instances and make changes to the configuration of the software instances. The configuration information for each of the software instances can be stored as a machine image (MI) 442 on the network-attached storage 440. Specifically, the MI 442 describes the information used to launch a VM instance. The MI can include a template for a root volume of the instance (e.g., an OS and applications), launch permissions for controlling which customer accounts can use the MI, and a block device mapping which specifies volumes to attach to the instance when the instance is launched. The MI can also include a reference to a configurable hardware image (CHI) 442 which is to be loaded on configurable hardware 404 when the instance is launched. The CHI includes configuration data for programming or configuring at least a portion of the configurable hardware 404.

The customer can also specify settings regarding how the purchased instances are to be scaled in response to demand. The management component can further include a policy document to implement customer policies. An auto scaling component 424 can scale the instances 406 based upon rules defined by the customer. In one embodiment, the auto scaling component 424 allows a customer to specify scale-up rules for use in determining when new instances should be instantiated and scale-down rules for use in determining when existing instances should be terminated. The auto scaling component 424 can consist of a number of subcomponents executing on different server computers 402 or other computing devices. The auto scaling component 424 can monitor available computing resources over an internal management network and modify resources available based on need.

A deployment component 426 can be used to assist customers in the deployment of new instances 406 of computing resources. The deployment component can have access to account information associated with the instances, such as who is the owner of the account, credit card information, country of the owner, etc. The deployment component 426 can receive a configuration from a customer that includes data describing how new instances 406 should be configured. For example, the configuration can specify one or more applications to be installed in new instances 406, provide scripts and/or other types of code to be executed for configuring new instances 406, provide cache logic specifying how an application cache should be prepared, and other types of information. The deployment component 426 can utilize the customer-provided configuration and cache logic to configure, prime, and launch new instances 406. The configuration, cache logic, and other information may be specified by a customer using the management component 422 or by providing this information directly to the deployment component 426. The instance manager can be considered part of the deployment component.

Customer account information 428 can include any desired information associated with a customer of the multi-tenant environment. For example, the customer account information can include a unique identifier for a customer, a customer address, billing information, licensing information, customization parameters for launching instances, scheduling information, auto-scaling parameters, previous IP addresses used to access the account, a listing of the MI's and CHI's accessible to the customer, etc.

One or more server computers 430 can be reserved for executing software components for managing the download of configuration data to configurable hardware 404 of the server computers 402. For example, the server computer 430 can execute a logic repository service comprising an ingestion component 432, a library management component 434, and a download component 436. The ingestion component 432 can receive host logic and application logic designs or specifications and generate configuration data that can be used to configure the configurable hardware 404. The library management component 434 can be used to manage source code, user information, and configuration data associated with the logic repository service. For example, the library management component 434 can be used to store configuration data generated from a user's design in a location specified by the user on the network-attached storage 440. In particular, the configuration data can be stored within a configurable hardware image 442 on the network-attached storage 440. Additionally, the library management component 434 can manage the versioning and storage of input files (such as the specifications for the application logic and the host logic) and metadata about the logic designs and/or the users of the logic repository service. The library management component 434 can index the generated configuration data by one or more properties such as a user identifier, an instance type, a marketplace identifier, a machine image identifier, and a configurable hardware identifier, for example. The download component 436 can be used to authenticate requests for configuration data and to transmit the configuration data to the requestor when the request is authenticated. For example, agents on the server computers 402A-B can send requests to the download component 436 when the instances 406 are launched that use the configurable hardware 404. As another example, the agents on the server computers 402A-B can send requests to the download component 436 when the instances 406 request that the configurable hardware 404 be partially reconfigured while the configurable hardware 404 is in operation.

The network-attached storage (NAS) 440 can be used to provide storage space and access to files stored on the NAS 440. For example, the NAS 440 can include one or more server computers used for processing requests using a network file sharing protocol, such as Network File System (NFS). The NAS 440 can include removable or non-removable media, including magnetic disks, storage area networks (SANs), redundant arrays of independent disks (RAID), magnetic tapes or cassettes, CD-ROMs, DVDs, or any other medium which can be used to store information in a non-transitory way and which can be accessed over the network 450.

The network 450 can be utilized to interconnect the server computers 402A-402C, the server computers 420 and 430, and the storage 440. The network 450 can be a local area network (LAN) and can be connected to a Wide Area Network (WAN) 460 so that end users can access the compute service provider 400. It should be appreciated that the network topology illustrated in FIG. 4 has been simplified and that many more networks and networking devices can be utilized to interconnect the various computing systems disclosed herein.

Figure 5:
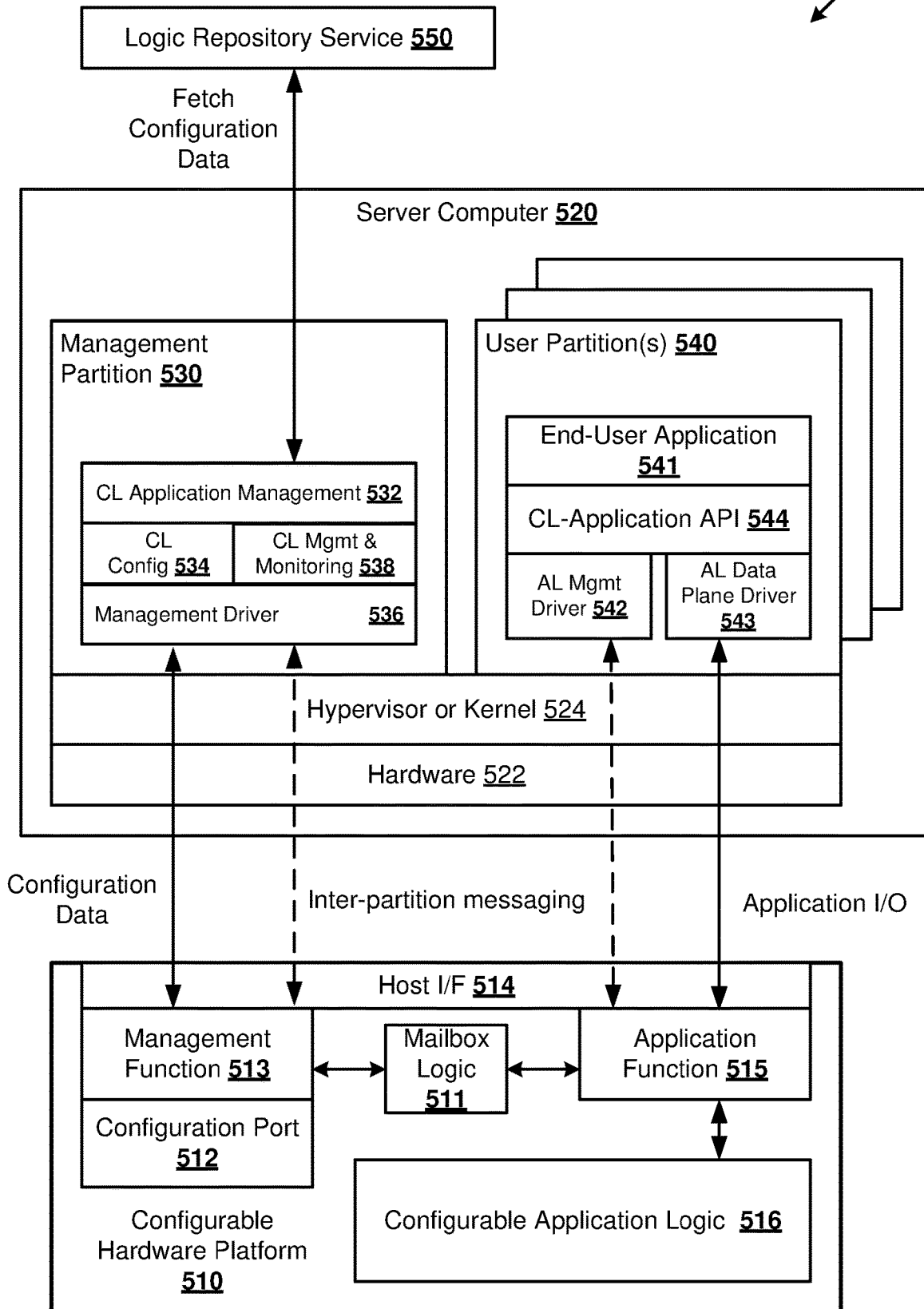
FIG. 5 shows further details of the example system of FIG. 4 including components of a control plane and a data plane for configuring and interfacing to a configurable hardware platform.

FIG. 5 shows further details of an example system 500 including components of a control plane and a data plane for configuring and interfacing to a configurable hardware platform 510. The control plane includes functions for initializing, monitoring, reconfiguring, and tearing down the configurable hardware platform 510. The data plane includes functions for communicating between a user's application and the configurable hardware platform 510. The control plane can be accessible by users or services having a higher privilege level and the data plane can be accessible by users or services having a lower privilege level. In one embodiment, the configurable hardware platform 510 is connected to a server computer 520 using a local interconnect, such as PCIe. In an alternative embodiment, the configurable hardware platform 510 can be integrated within the hardware of the server computer 520. As one example, the server computer 520 can be one of the plurality of server computers 402A-402B of the compute service provider 400 of FIG. 4.

The server computer 520 has underlying hardware 522 including one or more CPUs, memory, storage devices, interconnection hardware, etc. Running a layer above the hardware 522 is a hypervisor or kernel layer 524. The hypervisor or kernel layer can be classified as a type 1 or type 2 hypervisor. A type 1 hypervisor runs directly on the host hardware 522 to control the hardware and to manage the guest operating systems. A type 2 hypervisor runs within a conventional operating system environment. Thus, in a type 2 environment, the hypervisor can be a distinct layer running above the operating system and the operating system interacts with the system hardware. Different types of hypervisors include Xen-based, Hyper-V, ESXi/ESX, Linux, etc., but other hypervisors can be used. A management partition 530 (such as Domain 0 of the Xen hypervisor) can be part of the hypervisor or separated therefrom and generally includes device drivers needed for accessing the hardware 522. User partitions 540 are logical units of isolation within the hypervisor. Each user partition 540 can be allocated its own portion of the hardware layer's memory, CPU allocation, storage, interconnect bandwidth, etc. Additionally, each user partition 540 can include a virtual machine and its own guest operating system. As such, each user partition 540 is an abstract portion of capacity designed to support its own virtual machine independent of the other partitions.

The management partition 530 can be used to perform management services for the user partitions 540 and the configurable hardware platform 510. The management partition 530 can communicate with web services (such as a deployment service, a logic repository service 550, and a health monitoring service) of the compute service provider, the user partitions 540, and the configurable hardware platform 510. The management services can include services for launching and terminating user partitions 540, and configuring, reconfiguring, and tearing down the configurable logic of the configurable hardware platform 510. As a specific example, the management partition 530 can launch a new user partition 540 in response to a request from a deployment service (such as the deployment component 426 of FIG. 4). The request can include a reference to an MI and/or a CHI. The MI can specify programs and drivers to load on the user partition 540 and the CHI can specify configuration data to load on the configurable hardware platform 510. The management partition 530 can initialize the user partition 540 based on the information associated with the MI and can cause the configuration data associated with the CHI to be loaded onto the configurable hardware platform 510. The initialization of the user partition 540 and the configurable hardware platform 510 can occur concurrently so that the time to make the instance operational can be reduced.

The management partition 530 can be used to manage programming and monitoring of the configurable hardware platform 510. By using the management partition 530 for this purpose, access to the configuration data and the configuration ports of the configurable hardware platform 510 can be restricted. Specifically, users with lower privilege levels can be restricted from directly accessing the management partition 530. Thus, the configurable logic cannot be modified without using the infrastructure of the compute services provider and any third party IP used to program the configurable logic can be protected from viewing by unauthorized users.

The management partition 530 can include a software stack for the control plane to configure and interface to a configurable hardware platform 510. The control plane software stack can include a configurable logic (CL) application management layer 532 for communicating with web services (such as the logic repository service 550 and a health monitoring service), the configurable hardware platform 510, and the user partitions 540. For example, the CL application management layer 532 can issue a request to the logic repository service 550 to fetch configuration data in response to a user partition 540 being launched. The CL application management layer 532 can communicate with the user partition 540 using shared memory of the hardware 522 or by sending and receiving inter-partition messages over the interconnect connecting the server computer 520 to the configurable hardware platform 510. Specifically, the CL application management layer 532 can read and write messages to mailbox logic 511 of the configurable hardware platform 510. The messages can include requests by an end-user application 541 to reconfigure or tear-down the configurable hardware platform 510. The CL application management layer 532 can issue a request to the logic repository service 550 to fetch configuration data in response to a request to reconfigure the configurable hardware platform 510. The CL application management layer 532 can initiate a tear-down sequence in response to a request to tear down the configurable hardware platform 510. The CL application management layer 532 can perform watchdog related activities to determine whether the communication path to the user partition 540 is functional.

The control plane software stack can include a CL configuration layer 534 for accessing the configuration port 512 (e.g., a configuration access port) of the configurable hardware platform 510 so that configuration data can be loaded onto the configurable hardware platform 510. For example, the CL configuration layer 534 can send a command or commands to the configuration port 512 to perform a full or partial configuration of the configurable hardware platform 510. The CL configuration layer 534 can send the configuration data (e.g., a bitstream) to the configuration port 512 so that the configurable logic can be programmed according to the configuration data. The configuration data can specify host logic and/or application logic.

The control plane software stack can include a management driver 536 for communicating over the physical interconnect connecting the server computer 520 to the configurable hardware platform 510. The management driver 536 can encapsulate commands, requests, responses, messages, and data originating from the management partition 530 for transmission over the physical interconnect. Additionally, the management driver 536 can de-encapsulate commands, requests, responses, messages, and data sent to the management partition 530 over the physical interconnect. Specifically, the management driver 536 can communicate with the management function 513 of the configurable hardware platform 510. For example, the management function 513 can be a physical or virtual function mapped to an address range during an enumeration of devices connected to the physical interconnect. The management driver 536 can communicate with the management function 513 by addressing transactions to the address range assigned to the management function 513.

The control plane software stack can include a CL management and monitoring layer 538. The CL management and monitoring layer 538 can monitor and analyze transactions occurring on the physical interconnect to determine a health of the configurable hardware platform 510 and/or to determine usage characteristics of the configurable hardware platform 510. For example, the CL management and monitoring layer 538 can monitor whether configuration data is successfully deployed on the configurable hardware platform 510 and can cause a report to be transmitted to the logic repository service 550 indicating the status of the deployment.

The configurable hardware platform 510 can include non-configurable hard macros and configurable logic. The hard macros can perform specific functions within the configurable hardware platform 510, such as input/output blocks (e.g., serializer and deserializer (SERDES) blocks and gigabit transceivers), analog-to-digital converters, memory control blocks, test access ports, and a configuration port 512. The configurable logic can be programmed or configured by loading configuration data onto the configurable hardware platform 510. For example, the configuration port 512 can be used for loading the configuration data. As one example, configuration data can be stored in a memory (such as a Flash memory) accessible by the configuration port 512 and the configuration data can be automatically loaded during an initialization sequence (such as during a power-on sequence) of the configurable hardware platform 510. Additionally, the configuration port 512 can be accessed using an off-chip processor or an interface within the configurable hardware platform 510.

The configurable logic can be programmed to include host logic and application logic. The host logic can shield the interfaces of at least some of the hard macros from the end-users so that the end-users have limited access to the hard macros and to the physical interconnect. For example, the host logic can include the mailbox logic 511, the configuration port 512, the management function 513, the host interface 514, and the application function 515. The end-users can cause the configurable application logic 516 to be loaded on the configurable hardware platform 510, and can communicate with the configurable application logic 516 from the user partitions 540 (via the application function 515).

The host interface logic 514 can include circuitry (e.g., hard macros and/or configurable logic) for signaling on the physical interconnect and implementing a communications protocol. The communications protocol specifies the rules and message formats for communicating over the interconnect. The application function 515 can be used to communicate with drivers of the user partitions 540. Specifically, the application function 515 can be a physical or virtual function mapped to an address range during an enumeration of devices connected to the physical interconnect. The application drivers can communicate with the application function 515 by addressing transactions to the address range assigned to the application function 515. Specifically, the application function 515 can communicate with an application logic management driver 542 to exchange commands, requests, responses, messages, and data over the control plane. The application function 515 can communicate with an application logic data plane driver 543 to exchange commands, requests, responses, messages, and data over the data plane.

The mailbox logic 511 can include one or more buffers and one or more control registers. For example, a given control register can be associated with a particular buffer and the register can be used as a semaphore to synchronize between the management partition 530 and the user partition 540. As a specific example, if a partition can modify a value of the control register, the partition can write to the buffer. The buffer and the control register can be accessible from both the management function 513 and the application function 515. When the message is written to the buffer, another control register (e.g., the message ready register) can be written to indicate the message is complete. The message ready register can polled by the partitions to determine if a message is present, or an interrupt can be generated and transmitted to the partitions in response to the message ready register being written.

The user partition 540 can include a software stack for interfacing an end-user application 540 to the configurable hardware platform 510. The application software stack can include functions for communicating with the control plane and the data plane. Specifically, the application software stack can include a CL-Application API 544 for providing the end-user application 540 with access to the configurable hardware platform 510. The CL-Application API 544 can include a library of methods or functions for communicating with the configurable hardware platform 510 and the management partition 530. For example, the end-user application 541 can send a command or data to the configurable application logic 516 by using an API of the CL-Application API 544. In particular, the API of the CL-Application API 544 can interface with the application logic (AL) data plane driver 543 which can generate a transaction targeted to the application function 515 which can communicate with the configurable application logic 516. In this manner, the end-user application 541 can cause the configurable application logic 516 receive, process, and/or respond with data to potentially accelerate tasks of the end-user application 541. As another example, the end-user application 541 can send a command or data to the management partition 530 by using an API of the CL-Application API 544. In particular, the API of the CL-Application API 544 can interface with the AL management driver 542 which can generate a transaction targeted to the application function 515 which can communicate with the mailbox logic 511. In this manner, the end-user application 541 can cause the management partition 530 to provide operational or metadata about the configurable hardware platform 510 and/or to request that the configurable application logic 516 be reconfigured.

The application software stack in conjunction with the hypervisor or kernel 524 can be used to limit the operations available to perform over the physical interconnect by the end-user application 541. For example, the compute services provider can provide the AL management driver 542, the AL data plane driver 543, and the CL-Application API 544 (such as by associating the files with a machine image). These components can be protected from modification by only permitting users and services having a higher privilege level than the end-user to write to the files. The AL management driver 542 and the AL data plane driver 543 can be restricted to using only addresses within the address range of the application function 515. Additionally, an input/output memory management unit (I/O MMU) can restrict interconnect transactions to be within the address ranges of the application function 515 or the management function 513.

Figure 6:
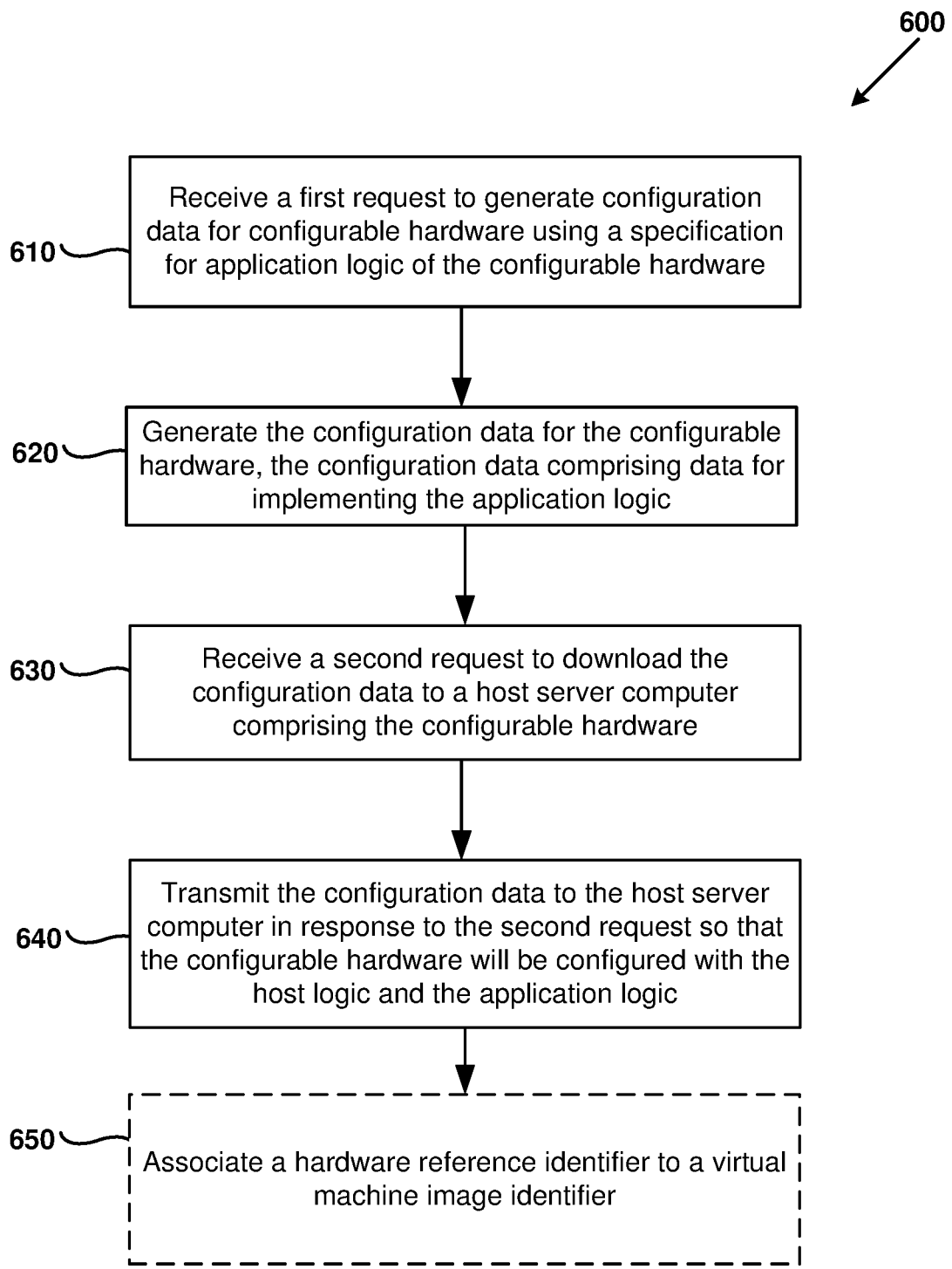
FIGS. 6-7 are flow diagrams of example methods of managing configuration data for configuring configurable hardware in a multi-tenant environment.

FIG. 6 is a flow diagram of an example method 600 for managing configuration data that can be used to configure or program configurable hardware in, for example, a multi-tenant environment. As one example, the method 600 can be implemented using a logic repository service, such as described with reference to FIGS. 1-3.

At 610, a first request can be received to generate configuration data for configurable hardware using a specification for application logic of the configurable hardware. The specification for the application logic can include source code (e.g., HDL or RTL source code), a netlist, and/or configuration data corresponding to the application logic. The request can specify an instance type associated with the configuration data. The request can include an access list indicating users that can access the configuration data. The request can include a version of host logic to use with the application logic.

At 620, the configuration data can be generated for the configurable hardware.

Generating the configuration data can include verifying the application logic complies with one or more criteria of the compute services provider, integrating the application logic into a host logic wrapper, synthesizing the application logic, and/or placing and routing the application logic. The configuration data can include data for implementing the application logic and/or host logic on the configurable hardware. The configuration data can include data for implementing multiple components at one or more times during the operation of the configurable hardware. For example, the configuration data can include a static logic component (to be loaded during an initialization sequence of the configurable hardware) and one or more reconfigurable components (to be loaded after the initialization sequence of the configurable hardware). The different reconfigurable components can be associated with overlapping or non-overlapping regions of the configurable hardware. The configuration data can include a host logic component and/or an application logic component. The configuration data can be generated in one or more formats. As one example, the configuration data can be a full or partial bitstream. Information associated with the configuration data can also be generated. For example, log files, implementation reports, and timing reports can be generated with the configuration data. The implementation and timing reports can be used by a developer or design system to modify, resynthesize, or re-place-and-route the design for the configurable hardware.

At 630, a second request can be received to download the configuration data to a host server computer comprising the configurable hardware. For example, the second request can be for static logic (such as for a host logic design) to be downloaded to the configurable hardware when a new virtual machine instance is launched. As another example, the request can be for reconfigurable logic to be downloaded onto the configurable hardware after the configurable hardware platform is executing. In particular, the request can be for configuration data corresponding to an application logic design. The second request can include information for authorizing a user to access the configuration data.

At 640, the configuration data can be transmitted to the host server computer in response to the second request so that the configurable hardware will be configured with the host logic and the application logic. In particular, the configuration data can be transmitted to a management partition of the host server computer and the management partition can cause the configuration data to be loaded onto the configurable hardware. As one example, the configuration data can be transmitted after the requestor is verified to have access to the configuration data.

At 650, a hardware reference identifier can be associated with a virtual machine identifier. For example, the second request (from 630) can include the virtual machine identifier for identifying the configuration data to download. In this manner, the deployment of a virtual machine using the virtual machine image identifier can automatically request configuration data associated with the hardware reference identifier to be downloaded when the virtual machine is instantiated.

Figure 7:
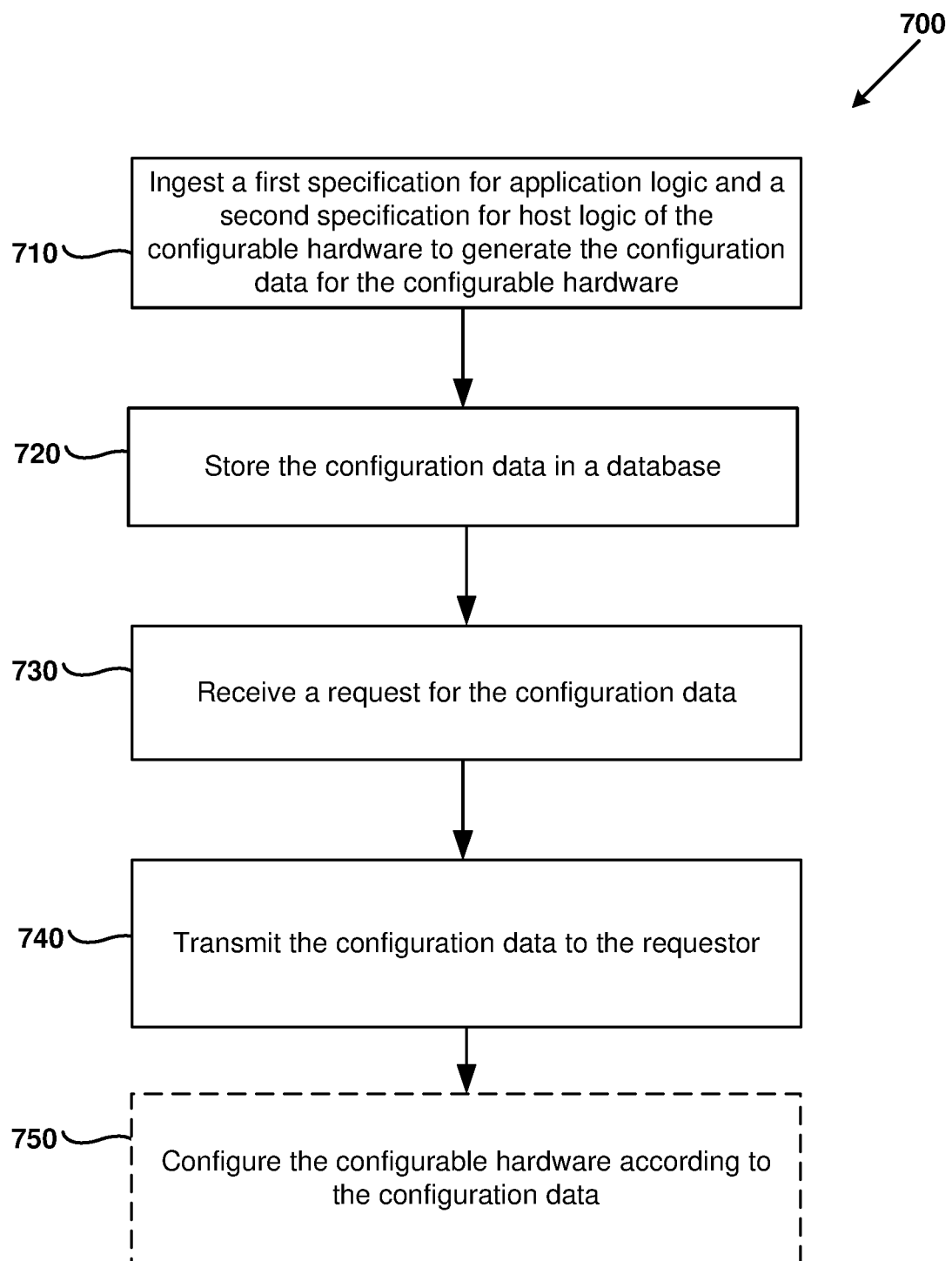

FIG. 7 is a flow diagram of an example method 700 of managing configuration data that can be used to configure or program configurable hardware in, for example, a multi-tenant environment. For example, the method 700 can be implemented by a logic repository service, such as described above in reference to FIGS. 1-3.

At 710, a first specification for application logic of the configurable hardware can be ingested. Additionally, a second specification for host logic of the configurable hardware can be ingested. The first and second specifications can be used to generate the configuration data for the configurable hardware. For example, the specifications can include HDL or RTL source code, a netlist, and/or a partial bitstream for the host logic and the application logic. When the specification includes source code, the source code can be synthesized to generate a netlist. A netlist can be placed and routed to generate configuration data. The configuration data can be formatted in a variety of formats, such as a bitstream that identifies programming or settings for individual components of the configurable hardware.

At 720, the configuration data can be stored in a database. For example, configuration data can be stored in a logic repository database, such as the logic repository database 150. The configuration data can be stored in association with a machine image, a user, a configurable hardware image, a product code, or any other information that can be used to retrieve the information data. The configuration data can be stored in association with the first and second specifications, and/or with a suite of verification tests. The configuration data can be stored in association with an access list so that the configuration data can be accessed by developers and/or end-users of the configuration data.

At 730, a request for the configuration data can be received. For example, a request can be received when deploying a new instance within the compute resources provided by the compute service provider. As another example, the request can be received in response to a user application requesting the configuration data to be downloaded during execution of the application. As another example, the request can be received in response to a developer or the compute services provider updating, viewing, or testing the configuration data.

At 740, the configuration data can be transmitted to the requester. For example, the configuration data can be transmitted to the requester after access privileges of the requester have been verified.

At 750, the configurable hardware can be configured according to the configuration data. Once configured, the configurable hardware can include the functions specified by the host logic design and the application logic design.

Figure 8:
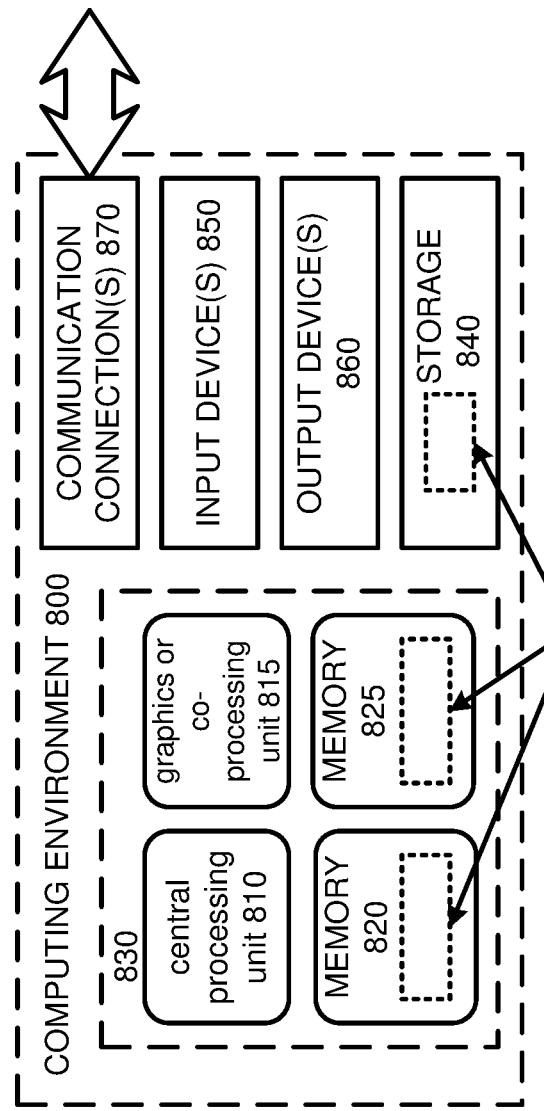
FIG. 8 depicts a generalized example of a suitable computing environment in which the described innovations may be implemented.

FIG. 8 depicts a generalized example of a suitable computing environment 800 in which the described innovations may be implemented. The computing environment 800 is not intended to suggest any limitation as to scope of use or functionality, as the innovations may be implemented in diverse general-purpose or special-purpose computing systems. For example, the computing environment 800 can be any of a variety of computing devices (e.g., desktop computer, laptop computer, server computer, tablet computer, etc.)

With reference to FIG. 8, the computing environment 800 includes one or more processing units 810, 815 and memory 820, 825. In FIG. 8, this basic configuration 830 is included within a dashed line. The processing units 810, 815 execute computer-executable instructions. A processing unit can be a general-purpose central processing unit (CPU), processor in an application-specific integrated circuit (ASIC) or any other type of processor. In a multi-processing system, multiple processing units execute computer-executable instructions to increase processing power. For example, FIG. 8 shows a central processing unit 810 as well as a graphics processing unit or co-processing unit 815. The tangible memory 820, 825 may be volatile memory (e.g., registers, cache, RAM), non-volatile memory (e.g., ROM, EEPROM, flash memory, etc.), or some combination of the two, accessible by the processing unit(s). The memory 820, 825 stores software 880 implementing one or more innovations described herein, in the form of computer-executable instructions suitable for execution by the processing unit(s).

A computing system may have additional features. For example, the computing environment 800 includes storage 840, one or more input devices 850, one or more output devices 860, and one or more communication connections 870. An interconnection mechanism (not shown) such as a bus, controller, or network interconnects the components of the computing environment 800. Typically, operating system software (not shown) provides an operating environment for other software executing in the computing environment 800, and coordinates activities of the components of the computing environment 800.

The tangible storage 840 may be removable or non-removable, and includes magnetic disks, magnetic tapes or cassettes, CD-ROMs, DVDs, or any other medium which can be used to store information in a non-transitory way and which can be accessed within the computing environment 800. The storage 840 stores instructions for the software 880 implementing one or more innovations described herein.

The input device(s) 850 may be a touch input device such as a keyboard, mouse, pen, or trackball, a voice input device, a scanning device, or another device that provides input to the computing environment 800. The output device(s) 860 may be a display, printer, speaker, CD-writer, or another device that provides output from the computing environment 800.

The communication connection(s) 870 enable communication over a communication medium to another computing entity. The communication medium conveys information such as computer-executable instructions, audio or video input or output, or other data in a modulated data signal. A modulated data signal is a signal that has one or more of its characteristics set or changed in such a manner as to encode information in the signal. By way of example, and not limitation, communication media can use an electrical, optical, RF, or other carrier.

Although the operations of some of the disclosed methods are described in a particular, sequential order for convenient presentation, it should be understood that this manner of description encompasses rearrangement, unless a particular ordering is required by specific language set forth below. For example, operations described sequentially may in some cases be rearranged or performed concurrently. Moreover, for the sake of simplicity, the attached figures may not show the various ways in which the disclosed methods can be used in conjunction with other methods.

Any of the disclosed methods can be implemented as computer-executable instructions stored on one or more computer-readable storage media (e.g., one or more optical media discs, volatile memory components (such as DRAM or SRAM), or non-volatile memory components (such as flash memory or hard drives)) and executed on a computer (e.g., any commercially available computer, including smart phones or other mobile devices that include computing hardware). The term computer-readable storage media does not include communication connections, such as signals and carrier waves. Any of the computer-executable instructions for implementing the disclosed techniques as well as any data created and used during implementation of the disclosed embodiments can be stored on one or more computer-readable storage media. The computer-executable instructions can be part of, for example, a dedicated software application or a software application that is accessed or downloaded via a web browser or other software application (such as a remote computing application). Such software can be executed, for example, on a single local computer (e.g., any suitable commercially available computer) or in a network environment (e.g., via the Internet, a wide-area network, a local-area network, a client-server network (such as a cloud computing network), or other such network) using one or more network computers.

For clarity, only certain selected aspects of the software-based implementations are described. Other details that are well known in the art are omitted. For example, it should be understood that the disclosed technology is not limited to any specific computer language or program. For instance, the disclosed technology can be implemented by software written in C++, Java, Perl, JavaScript, Adobe Flash, or any other suitable programming language. Likewise, the disclosed technology is not limited to any particular computer or type of hardware. Certain details of suitable computers and hardware are well known and need not be set forth in detail in this disclosure.

It should also be well understood that any functionality described herein can be performed, at least in part, by one or more hardware logic components, instead of software. For example, and without limitation, illustrative types of hardware logic components that can be used include Field-programmable Gate Arrays (FPGAs), Application-specific Integrated Circuits (ASICs), Application-specific Standard Products (ASSPs), System-on-a-chip systems (SOCs), Complex Programmable Logic Devices (CPLDs), etc.

Furthermore, any of the software-based embodiments (comprising, for example, computer-executable instructions for causing a computer to perform any of the disclosed methods) can be uploaded, downloaded, or remotely accessed through a suitable communication means. Such suitable communication means include, for example, the Internet, the World Wide Web, an intranet, software applications, cable (including fiber optic cable), magnetic communications, electromagnetic communications (including RF, microwave, and infrared communications), electronic communications, or other such communication means.

The disclosed methods, apparatus, and systems should not be construed as limiting in any way. Instead, the present disclosure is directed toward all novel and nonobvious features and aspects of the various disclosed embodiments, alone and in various combinations and subcombinations with one another. The disclosed methods, apparatus, and systems are not limited to any specific aspect or feature or combination thereof, nor do the disclosed embodiments require that any one or more specific advantages be present or problems be solved.

In view of the many possible embodiments to which the principles of the disclosed invention may be applied, it should be recognized that the illustrated embodiments are only preferred examples of the invention and should not be taken as limiting the scope of the invention. Rather, the scope of the invention is defined by the following claims. We therefore claim as our invention all that comes within the scope of these claims.

What is claimed is:

1. A method, comprising:
   receiving a third-party request to generate configuration data for a field-programmable gate array (FPGA), the third-party request comprising a hardware accelerator design for implementation on the FPGA;
   generating a validated bitstream based on the hardware accelerator design for configuring the FPGA;
   storing the validated bitstream together with other validated bitstreams in a logic repository service of a compute service provider;
   receiving a request in the compute service provider to download the validated bitstream to a host server computer, the host server computer comprising the FPGA; and
   programming the FPGA with the hardware accelerator design on the host server computer in response to the request.

2. The method of claim 1, further including integrating host logic into the hardware accelerator design when generating the validated bitstream.

3. The method of claim 1, wherein generating the validated bitstream comprises synthesizing the hardware accelerator design with host logic to generate a netlist compatible with the FPGA.

4. The method of claim 1, wherein the received hardware accelerator design comprises a netlist, and wherein generating the validated bitstream comprises routing for the hardware accelerator design.

5. The method of claim 1, wherein the third-party request further comprises an instance type of the FPGA, and the validated bitstream is generated based on the instance type.

6. The method of claim 1, wherein the FPGA comprises multiple configurable regions and the validated bitstream is for configuring a portion of the regions.

7. The method of claim 1, wherein the request includes an instance to launch on the host server computer.

8. The method of claim 1, wherein the validated bitstreams of the logic repository service are available for use by different users of the compute service provider.

9. A method comprising:
   in a compute service provider, receiving a first design of a hardware accelerator used for programming a field-programmable gate array (FPGA), the first design being received by a first organization for license by other users of the compute service provider;
   in the compute service provider, generating configuration data for the first design for programming the FPGA as the hardware accelerator;

storing the configuration data together with configuration data for other hardware designs from other organizations in a logic repository service within the compute service provider;

in the logic repository service, receiving a request to launch an instance on a host server computer within the compute service provider, the request identifying the first design of the hardware accelerator;

transmitting the configuration data for the first design to a host server computer including the FPGA to program the FPGA as the hardware accelerator; and launching the instance on the host server computer, wherein the instance uses the hardware accelerator.

10. The method of claim 9, wherein the first design comprises source code, and wherein the generating the configuration data comprises synthesizing the source code to generate a netlist for the FPGA.

11. The method of claim 9, wherein the generating the configuration data includes integrating host logic provided by the compute service provider into the hardware accelerator, wherein the host logic restricts functionality of the hardware accelerator.

12. The method of claim 11, wherein the generating the configuration data for the FPGA comprises validating that the hardware accelerator is compatible with the host logic.

13. The method of claim 9, wherein the generating the configuration data comprises assigning a hardware reference identifier to the configuration data, and wherein the request includes the hardware reference identifier.

14. The method of claim 13, further including associating the hardware reference identifier to a virtual machine image identifier, and wherein the request includes the virtual machine image identifier for launching the instance on the host server computer.

15. The method of claim 9, further comprising:
generating a timing report associated with the configuration data; and
storing the timing report at a location specified by the request.

16. A computing system, comprising:
a database; and
a logic repository service running on a first server computer coupled to the database, the logic repository service configured to:
receive a hardware accelerator design for programming a field-programmable gate array (FPGA);
generate configuration data usable to program the hardware accelerator design in the FPGA in a host server computer of a compute service provider;
store the configuration data in the database with other hardware designs available for users of the compute service provider;
receive a request to launch an instance on the host server computer and to program the hardware accelerator into the FPGA; and
transmit the configuration data to the host server computer and program the FPGA with the hardware accelerator design.

17. The computing system of claim 16, wherein the hardware accelerator design comprises source code, and wherein the generating the configuration data comprises synthesizing the source code to generate a netlist for the FPGA.

18. The computing system of claim 16, wherein the generating the configuration data includes integrating host logic provided by the compute service provider into the hardware accelerator design, wherein the host logic restricts functionality of the hardware accelerator design.

19. The computing system of claim 18, wherein the generating the configuration data for the FPGA comprises validating that the hardware accelerator design is compatible with the host logic.

20. The computing system of claim 16, wherein the database comprises a library of configurable hardware indexed by one or more of a configurable hardware image identifier, a virtual machine image identifier, or a product code.

* * * * *